United States Patent [19]

Radparvar

[11] Patent Number: 5,420,586
[45] Date of Patent: May 30, 1995

[54] SUPERCONDUCTING ANALOG TO DIGITAL CONVERTER TYPE CIRCUIT

[75] Inventor: Masoud Radparvar, Yorktown Heights, N.Y.

[73] Assignee: Hypres, Inc., Elmsford, N.Y.

[21] Appl. No.: 128,819

[22] Filed: Sep. 29, 1993

[51] Int. Cl.⁶ .................................. H03M 1/00
[52] U.S. Cl. ............................ 341/133; 341/171
[58] Field of Search .......................... 341/133, 171

[56] References Cited

U.S. PATENT DOCUMENTS

| | | | |
|---|---|---|---|
| 4,672,359 | 6/1987 | Silver | 341/133 |
| 4,866,373 | 9/1989 | Harada et al. | 324/127 |
| 4,956,642 | 9/1990 | Harada | 341/133 |
| 5,198,815 | 3/1993 | Przybysz et al. | 341/133 |

Primary Examiner—Marc S. Hoff
Attorney, Agent, or Firm—Henry I. Schanzer

[57] ABSTRACT

In circuits embodying the invention an analog input signal is magnetically coupled from an input superconducting loop to a second superconducting loop. The analog input signal present in the second loop is magnetically coupled to a third, superconducting comparator, loop in which there is generated current feedback pulses which are magnetically fed back to the second loop to reduce and nullify (i.e., reduce to zero) the magnetic flux and circulating current in the second loop induced by the analog input signal.

12 Claims, 5 Drawing Sheets

SUPERCONDUCTING ANALOG TO DIGITAL CONVERTER TYPE CIRCUIT

BACKGROUND OF THE INVENTION

This invention relates to high performance analog-to-digital (A/D) converters and magnetometers and, in particular, to A/D converters and magnetometers employing superconducting quantum interference devices (SQUIDs) and having a wide dynamic range.

SQUIDs include the combination of an inductance and one or more Josephson junctions. Josephson junctions have a current-voltage (I-V) characteristic of the type shown in FIG. 1 and, for ease of illustration, Josephson junctions are shown by an "X", in the appended drawings. Initially, prior to being powered, each Josephson junction is in a "superconductive" state (S-state) and functions as a short circuit, i.e., its resistance [and/or impedance] is zero. A Josephson junction remains in the S-state until the current through the Josephson junction exceeds the critical current (Ic) of the device. When the critical current (Ic) of the Josephson junction is exceeded, the device is then switched to what is termed the "normal" state (N-state). In going from the "S" state to the "normal" state, the characteristic of the device changes abruptly as shown in FIG. 1. In the "S" state, a Josephson junction exhibits zero impedance and zero voltage drop for current through the device below the critical current (Ic) of the device. In the "normal" state which may also be termed the "voltage" or "resistive" state, the Josephson junction exhibits a very high impedance for voltages of less than, for example, 2.5 millivolts and a somewhat lower but still significant impedance for voltages in excess of, for example, 2.5 millivolts applied or developed across the Josephson junction.

A superconducting quantum interference device (SQUID) is a circuit which includes one or more Josephson junctions and one or more inductive loads. A single junction SQUID includes the combination of a single Josephson junction connected across an inductance. A double junction SQUID includes the combination of an inductance and two Josephson junctions as shown, for example, in SQUIDs 82 and 84 of FIG. 2 and SQUIDs 24, 34, S1 and S2 of FIG. 3. A current may be injected into one end of, or across, the inductance of the SQUID and one end of each Josephson junction is connected to the SQUID inductor, and the other end of the Josephson junction may be returned to ground or some point of reference potential as shown in FIGS. 2, and 3.

It is known in the art to use single and double junction SQUIDs in analog-to-digital (A/D) converter and digital magnetometer systems as illustrated in U.S. Pat. No. 4,672,359 titled SUPERCONDUCTING ANALOG-TO-DIGITAL CONVERTER AND DIGITAL MAGNETOMETER AND RELATED METHOD FOR ITS USE issued to Arnold H. Silver; the teachings of which are incorporated herein by reference. It is also known in the art to operate a SQUID circuit as a "digital SQUID". In a particular application the "digital SQUID" is a SQUID which is operated as a comparator such that it receives an unknown magnetic flux and produces a comparator output in the form of a pulse sequence. This is described, for example, in an article titled JOSEPHSON INTEGRATED CIRCUITS III; A SINGLE-CHIP SQUID MAGNETOMETER by NORIO FUJIMAKI published in FUJITSU SCI. TECH. J. 27, 1, pp. 59-83 (April 1991); the teachings of which are also incorporated herein by reference.

The latter reference describes a single chip SQUID Magnetometer reproduced in FIG. 2 of this application. The circuit of FIG. 2 has many desirable features. However, it suffers from low dynamic range as explained below. In FIG. 2, the input signal source includes a first loop comprising a pick up coil 81 and an inductor L81. Signals in the first loop are coupled to a first SQUID sensor circuit which includes inductor L81 and a double junction SQUID 82 comprised of inductor L82 and Josephson junctions J82A and J82B. An AC bias source 83 is coupled to an input/output node 84. A resistor R81 and an inductor L83 are connected in series between node 84 and a node 85. A second SQUID circuit 84 comprised of inductor L84 and two Josephson junctions J84A, J84B is connected to node 85. Inductor L83 and SQUID 84 define what is referred to herein as a write gate. Two inductors, Lf1 and Lf2, are connected in series between node 85 and ground.

In the circuit of FIG. 2, AC BIAS source 83 produces bipolarity pulses which are applied to node 84 and SQUID 82.

In response to the presence of an analog input signal in coil L81 which is greater than zero and in the presence of bipolar pulses from bias source 83, the comparator SQUID produces either positive going pulses for one polarity of input signals, or negative going pulses for input signals of opposite polarity, to the one polarity. When the input signal is zero the comparator produces alternately positive going or negative going pulses. The pulses produced by the comparator SQUID 82 are supplied to a feedback circuit which includes a Write gate comprised of L83 and SQUID 84 comprised of L84, J84A and J84B. The write gate produces a feedback signal which increases (positively or negatively) by a predetermined value for each pulse (positively or negatively) produced by the comparator SQUID. The increasing feedback signal is fed back via inductors Lf1 and Lf2 to the SQUID sensor. The feedback signal increases until the amplitude of the magnetic flux fed back into L82 is equal and opposite to the input flux in L81, so as to cancel the effect of the input flux. The build up of the flux fed back in and to the SQUID sensor limits the dynamic range of the circuit. This is undesirable because it limits the maximum amplitude signals that can be measured.

The problem of limited dynamic range is significantly reduced in circuits embodying the invention.

SUMMARY OF THE INVENTION

In circuits embodying the invention an analog input signal is magnetically coupled from an input loop to a second loop. The analog input signal present in the second loop is magnetically coupled to a third, comparator, loop in which there is generated current feedback pulses which are magnetically fed back to the second loop to reduce and nullify (i.e., reduce to zero) the magnetic flux and circulating current in the second loop induced by the analog input signal.

According to one aspect of the invention, the second loop includes:

(a) a first portion (e.g., L1) magnetically coupled to the first loop for receiving and conducting a current proportional to the analog input current;

(b) a second portion (e.g., L2) magnetically coupled to the third loop for transmitting thereto a current proportional to the current in the second loop; and (c) a third portion (e.g., L11, L11A) magnetically coupled to the third loop for receiving feedback current pulses from the third loop having a polarity to reduce and nullify the current in the second loop.

According to another aspect of the invention, the third portion of the second loop includes a superconducting quantum interference device (SQUID) with two Josephson junctions.

Still further, in a preferred circuit embodying the invention, the third portion of the second loop includes two segments, each segment being denoted as a write gate, the first segment for producing current pulses of one polarity into the second loop and the other segment for producing current pulses of opposite polarity, to said one polarity, in the second loop, with each one of the two segments including a superconducting quantum interference device (SQUID) with two Josephson junctions.

According to still another aspect of the invention, the third comparator loop includes:

(a) a comparator comprised of a superconducting quantum interference device (SQUID) with two Josephson junctions;

(b) means for magnetically coupling from the second loop to the comparator SQUID a current proportional to the current in the second loop;

(c) means for supplying bidirectional clock pulses to the comparator SQUID; and (d) inductive means coupled to the comparator SQUID for carrying current pulses produced by the comparator SQUID and for coupling and feeding back the current pulses to the third portion of the second loop.

BRIEF DESCRIPTION OF THE DRAWINGS

In the accompanying figures like reference characters denote like components.

DETAILED DESCRIPTION OF THE INVENTION

Figure 1:
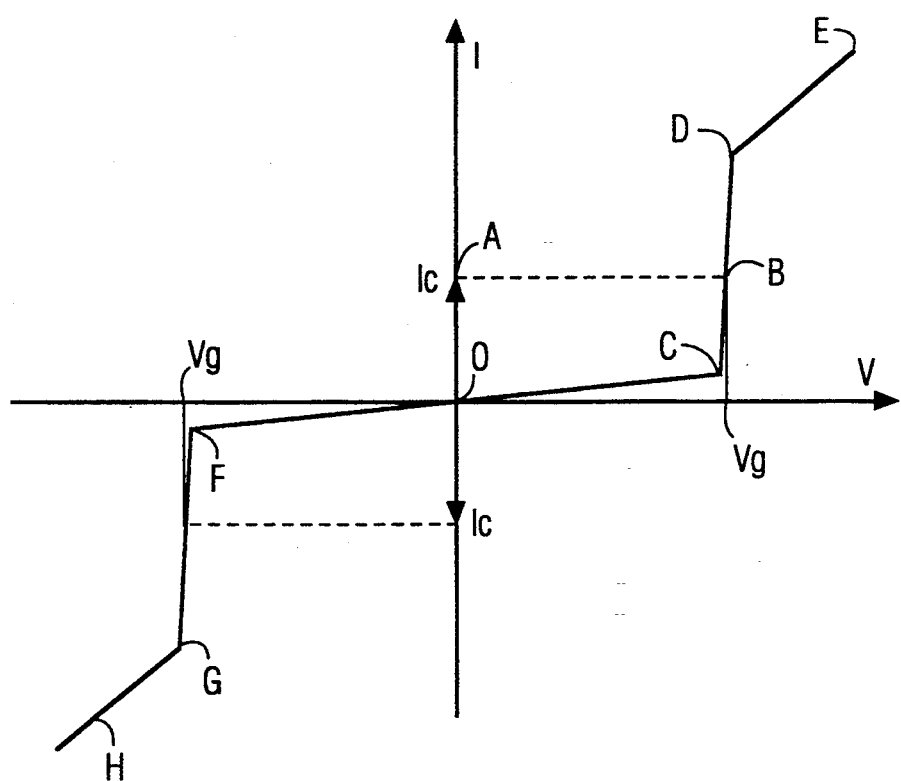
FIG. 1 is a simplified current-voltage (I-V) characteristic of a typical Josephson junction.
Figure 2:
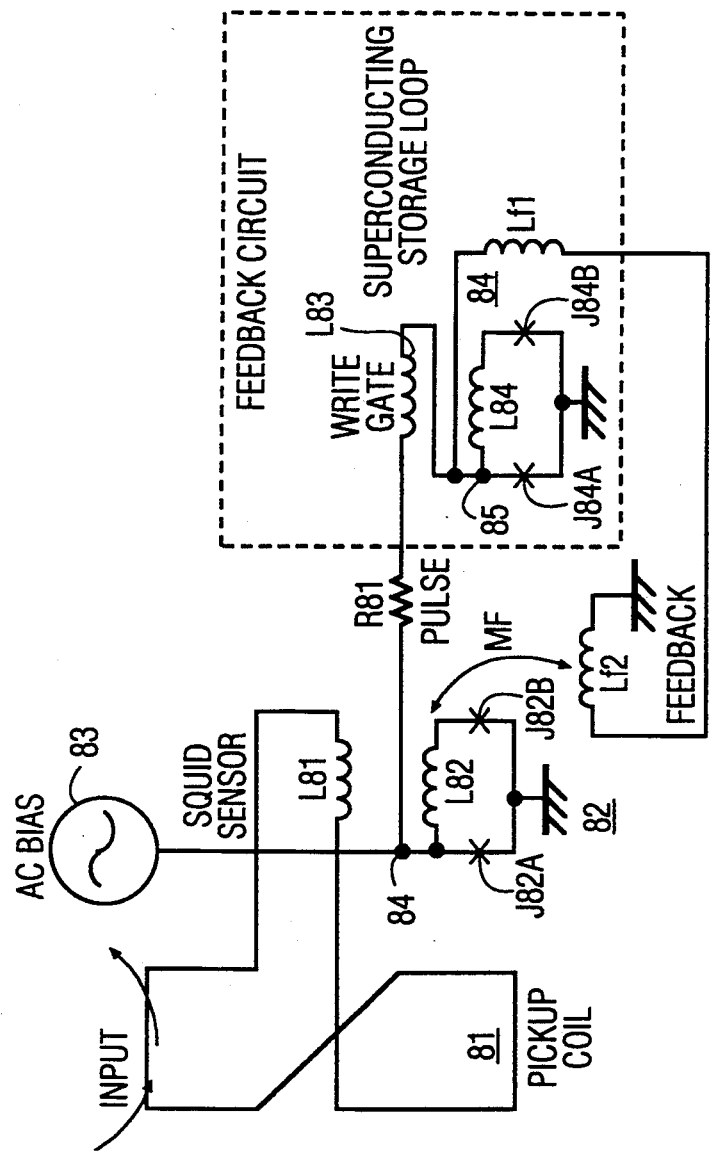
FIG. 2 is a schematic diagram of a prior art circuit.
Figure 3:
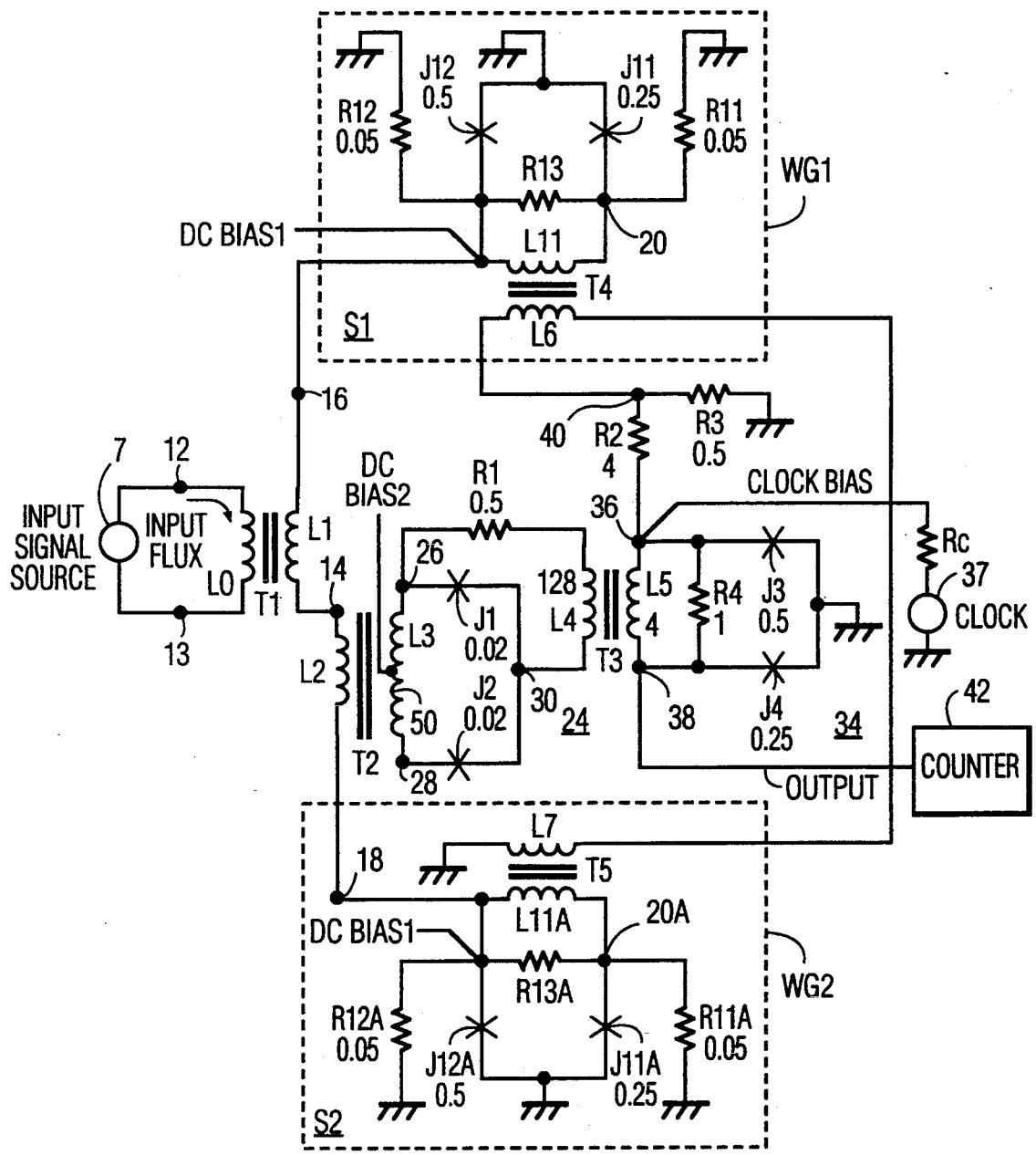
FIG. 3 is a schematic diagram of a circuit embodying the invention.

Referring to FIG. 3, there is shown an input signal source 7 coupled between signal input points 12 and 13 across which is connected a first superconducting winding L0. L0 is magnetically coupled to an inductor L1 connected between nodes 14 and 16 with the combination of L0 and L1 functioning as a transformer T1.

A first double junction SQUID S1 is connected to node 16. The combination of double junction SQUID S1 and an inductor L6 define a first write gate (WG1). An inductor L2 is connected at one end to node 14 and at its other end to a node 18 at which is connected a second SQUID S2. The combination of double junction SQUID S2 and an inductor L7 defines a second write gate (WG2). Each one of SQUIDs S1 and S2 includes an inductance (i.e., L11, L11A) across which is connected a damping resistor (i.e., R13, R13A). SQUID S1 includes an inductance L11 connected between nodes 16 and 20, a first Josephson junction J12 connected between node 16 and ground, and a second Josephson junction J11 connected between node 20 and ground. A damping resistor R12 is connected between node 16 and ground and a damping resistor R11 is connected between node 20 and ground. Also, a D.C. bias voltage (DC BIAS 1) is applied to node 16. Write gate 2 (WG2) is identical to write gate 1 in that inductor L11A resistor and resistor R13A are connected in parallel between nodes 18 and 20A, a damping resistor R12A is connected in parallel with a Josephson junction J12A between node 18 and ground, and a Josephson junction J11A and a resistor R11A are connected in parallel between node 20A and ground.

The same DC BIAS voltage (DC BIAS 1) is applied to nodes 16 and 18 of WG2, respectively. The presence of the bias current in the write gates (WG1, WG2) enables these gates to pulse when their thresholds are exceeded by the currents in inductors L6 and L7. In other words, the bias currents in write gates WG1 and WG2 are converted to current pulses that are launched into the inductors, L1 and L2 in response to feedback signals in L6, L7.

The flux through L2 is magnetically coupled via an inductor L3 to an ultra-sensitive analog SQUID 24 comprised of inductor L3 connected across nodes 26 and 28 and Josephson junctions J1 and J2 connected between nodes 26 and 28, respectively, and a node 30. The combination of inductors L2 and L3 functions as a transformer T2. A D.C. voltage bias (DC BIAS 2) is applied to a node 32 located along inductor L3. The DC BIAS 2 voltage and its value is set independently of the DC BIAS 1 voltage. A resistor R1 and an inductor L4 are connected in series between nodes 26 and 30. L4 functions to magnetically couple the input signal via an inductor L5 to the comparator SQUID circuit 34. The combination of inductors L4 and L5 functions as a transformer T3.

The comparator SQUID 34 includes an inductor L5, connected between nodes 36 and 38. The SQUID 34 also includes a resistor R4 connected between nodes 36 and 38, and Josephson junctions J3 and J4 respectively connected between nodes 36 and 38 and ground. A clock bias input derived from clock source 37 is also applied via resistance RC to node 36. The comparator 34 produces pulses at its output 38 which are coupled to a counter 42.

The comparator SQUID 34 produces positive and negative current pulses which are propagated from node 36 via a resistor R2 connected between nodes 36 and 40 and from node 40 via inductors L6 and L7 which are connected in series between node 40 and ground. L6 is magnetically coupled to inductor L11 of write gate 1 and 2 inductor L7 is magnetically coupled to inductor L11A of write gate 2. The combination of inductors L6 and L11 functions as a transformer T4 and the combination of inductors L7 and L11A functions as a transformer T5. A resistor R3 is connected between node 40 and ground.

A Counter 42 which functions to count the pulses produced at output node 38 of comparator 34 is an up/down counter formed of semiconductor or superconductive material.

Figure 4A:
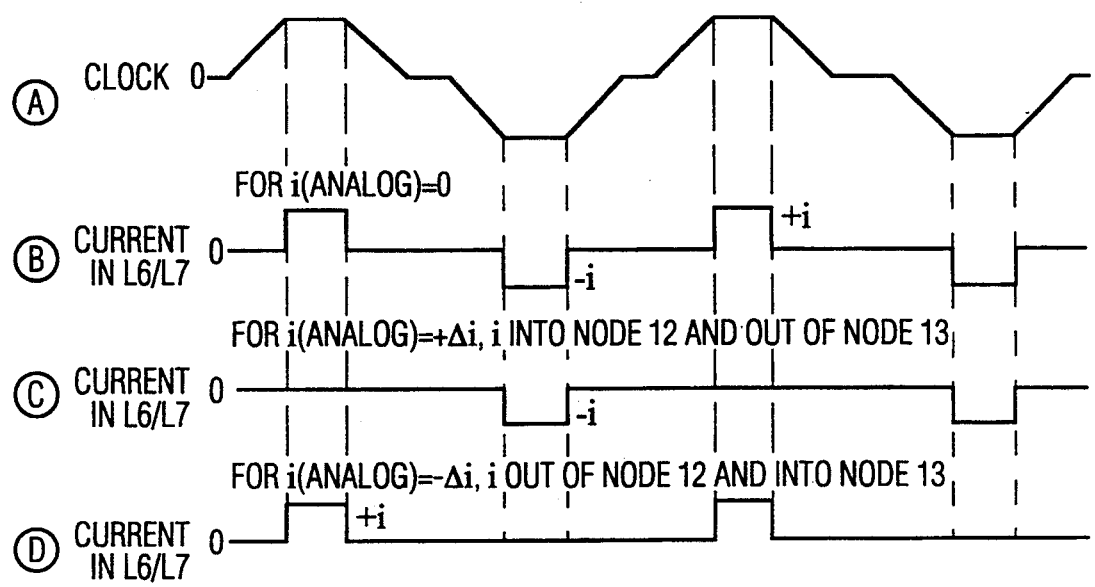
FIG. 4A is a diagram of waveforms illustrating the response of the comparator circuit to clock bias signals for three different input signal conditions.

Pertinent features of the operation of the circuit of FIG. 3 are described below. Assume first that the input signal across terminals 12 and 13 is zero and hence, the input flux, is a also zero. For this condition, the signal output of the analog SQUID 24 is also zero. At all times, the comparator 34 is biased with a bipolar current source identified as CLOCK BIAS which is supplied by clock source 37 of the type shown in waveform A of FIG. 4A. The response of the comparator circuit 34 and the currents flowing in inductors L6 and L7 for three different input conditions is shown in FIG. 4A.

Figure 4B:
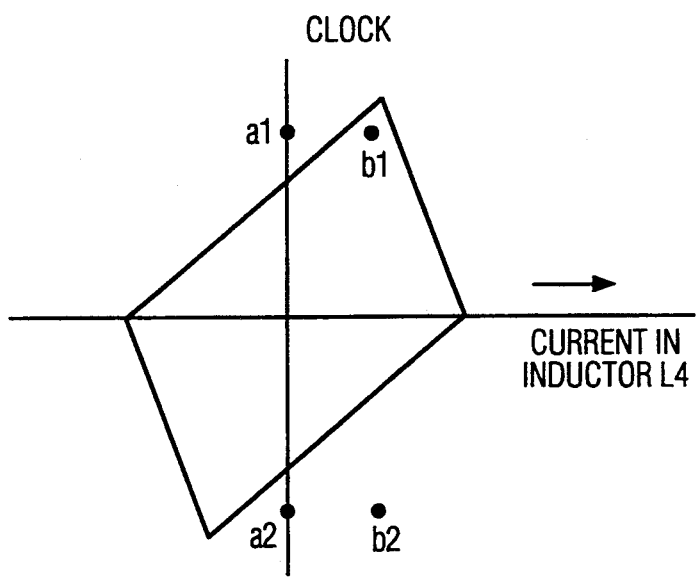
FIG. 4B is a diagram of the threshold characteristic of a comparator SQUID.

The operation of the comparator SQUID 34 is briefly as follows: In the absence of any current in the inductor L4, comparator 34 is driven by the clock bias such that it exceeds its threshold curve for both positive and negative clock pulses and consequently, pulses positively and negatively as shown in waveform B of FIG. 4A. When the current in L4 is non-zero (for example, positive), the operating point of comparator 34 moves from a point a1 and a point a2 to points b1 and b2, respectively, as shown in FIG. 4B. Since point b1 as shown in FIG. 4B is under the threshold curve, the comparator does not pulse for positive clock cycles and continues to pulse only for negative clock cycles and negative pulses are produced as shown in waveform C of FIG. 4A. (Point b2 is still over the threshold).

When the clock pulse at node 36 is positive, the current through L6 is coupled via L11 to write gate 1 and produces a pulse into inductor L1 and stores a positive current in the transformer. Likewise, when the clock pulse at node 36 is negative, the current through L7 is coupled via L11A to write gate 2 and produces a pulse into inductor L1 and stores a negative current in the transformer. When the input signal across input terminals 12 and 13 is zero, the current pulses through L6 and L7 produced in response to the clock pulses out of clock 37, go positive and negative, alternatively, in synchronism with the clock pulses as shown in waveforms A and B of FIG. 4A.

Now assume, for example, that a positive input signal current of 10 milliamperes (mA) is applied across input terminals 12 and 13; where positive is arbitrarily defined as conventional current into terminal 12 and out of terminal 13. Assume that a positive circulating current of 10 mA is also established in induction L1. The positive circulating current in L1 is coupled via the analog SQUID 24 to the comparator SQUID 34. That is, the positive circulating current in L1 is magnetically coupled via L2 to L3. The signals coupled via L3 into the analog SQUID 24 are then magnetically coupled via L4 and L5 to the comparator SQUID 34.

When the comparator is biased by the bipolar clock pulse, the bipolar clock pulses are super-imposed on the positive circulating current. This causes the comparator 34 to pulse only in the negative direction as shown in waveform C of FIG. 4A. These negative going pulses are coupled via L6 to inductor L11 and write gate 1 produces pulses of opposite polarity to the value of the analog input signal. Each "negative" write pulse reduces the amplitude of the magnetic flux in L1 until the flux in L1 induced by the analog input signal is reduced to zero.

When the input analog signal is negative (arbitrarily defined as current into node 13 and out of node 12) the input signal superimposed on the clock pulses causes the production of positive current pulses through L6 and L7 as shown in waveform D of FIG. 4A. These "positive" pulses flow through L6 and L7 so as to cause only write gate 2 to produce positive pulses through L1 relative to the "negative" analog input in L1. That is each positive pulse induces a positive pulse from L11A into L1 and L2 which reduces the "negative" flux induced in L1 and L2 by the analog input signal. Each "positive" pulse in L6 and L7 reduces the input flux by a fixed amount until the input flux in L1 and L2 is reduced to zero.

In brief, an essential aspect of the invention is that the pulses produced by comparator 34 and flowing through L6 and L7 activate the write gates (WG1 and WG2) such that the input signal responsive current in the superconducting loop comprising L1 and L2 is reduced to zero.

The polarity of the pulses produced by the write gates may be further explained as follows. Assume, for example, that when the current flows from left to right in inductor L6 (see waveform c of FIG. 4B), it causes WG1 to pulse positively, and that when current flows from right to left in L6 (see waveform D of FIG. 4A), nothing happens in WG1. By the same token, when current flows from left to right in L7, WG2 pulses positively and when current flows from right to left in L7, nothing happens in WG2.

If the clock bias is in positive cycle (i.e., the clock pulse is positive), it causes current to flow out of point 40 and from left to right in the inductor L6 and right to left in inductor L7. Using the above argument and when there is no signal current, then WG1 pulses and WG2 does not. When clock bias is negative (i.e., the clock pulse is negative), current is flowing into point 40. Consequently, current flows from right to left in L6 and left to right in inductor L7, whereby WG2 produces pulses for this condition and WG1 does not (again, for no signal current).

The operation of the comparator and feedback loop for the assumed condition of a "positive" 10 mA signal current induced in loop L1-L2 is briefly as follows:

The negative pulse from the WG1 is coupled via L6 and L11 (and hence, WG1) into the L1-L2 loop and subtracts from the positive circulating current. Where, for example, each negative pulse in the comparator loop produces a negative current in the L1-L2 loop which has an amplitude of 1 mA the positive circulating current in the L1-L2 loop is reduced by 1 mA each clock cycle. Thus, where the "positive" circulating current in L1-L2 has an original amplitude of 10 mA after the first clock cycle, the positive circulating current is reduced to a value of 9 mA and the reduced value of 9 mA in the L1-L2 loop is coupled to the comparator SQUID. On the next clock cycle, the comparator produces another negative current pulse (e.g., of 1 mA) which again is coupled via L6 and L11 into the transformer loop and reduces the positive circulating current from 9 mA to 8 mA. This process is repeated and continues until the current in the L1-L2 loop is reduced to, or approaches, zero.

For the example above, it will take ten clock cycles for the current in the L1-L2 loop to be reduced from 10 mA to zero. During these ten clock cycles the comparator 34 produces only negative going pulses at output node 38. Consequently, up/down counter 42 will produce a count of 10 indicative of the 10 clock cycles during which the comparator SQUID did not pulse positively.

The operation of the comparator and feedback loop for a "negative" analog input signal induced in loop L1-L2 would be as above except that "positive" pulses would be produced by comparator 34 and these would be coupled via L7 and L11A (and hence, WG2) into the L1-L2 loop to reduce the signal current in the loop to zero.

To summarize, the circuit of FIG. 3 uses a known analog SQUID 24 coupled to a simple comparator 34 to create a new class of digital SQUIDs. The detailed operation of the one bit digital SQUID circuit is such that the ultra-sensitive analog SQUID gate 24 is magnetically coupled to the comparator SQUID 34. SQUID 34 has an asymmetric threshold characteristic which is obtained by biasing SQUID 34 slightly over its critical current using a bipolar current source 37. In absence of any external field, the output voltage at the bias point 36 resembles the voltage shown in waveform B of FIG. 4A. For a sufficiently large positive applied magnetic field, the junction settles to points b1, b2 (see FIG. 4B) and only generates pulses in response to the negative portion of the applied gate current (see Waveform C) of FIG. 4A. In the circuit of FIG. 3, in order to get a one bit digital SQUID, a feed back loop containing two SQUID-based write gates and two inductors (L1 and L2) are paralleled and coupled to the comparator SQUID 34 (see FIG. 3). When the junction pulses positively (negatively) it launches fluxons (antifluxons) in the storage loop. Part of the storage inductor is coupled to the SQUID's series inductor. With proper polarity, the stored current in the superconducting storage loop can cancel the applied current and restore the comparator SQUID to its original state a1, a2 (see FIG. 4B).

This novel circuit scheme of FIG. 3 has practically infinite dynamic range. Its dynamic range is actually limited by the current capability of the input coil and its matching transformer. (The current capability of niobium thin film is approximately 5 mA per 1 μm width.) In this circuit, a single loop is used to couple both the input and the feed back flux to the comparator SQUID. The direction of the feedback current is chosen such that it cancels the applied field coupled to the transformer and to the comparator SQUID. Thus, the current in the loop is always close to zero. One advantage of this scheme is that the size of the loop can be very small. The polarity of the missing pulses determines the direction of the applied field. As noted above, multi-bit counter 42 coupled to the output of the one-bit digital SQUID can count the down pulses and subtract them from the up pulses to exhibit the output in digital form.

It should be appreciated that two write gates have been shown and used in FIG. 3. The use of two write gates is preferable for better control and to obtain bi-directional counting. However, a single write gate could also be used to generate the "subtracting" pulses to reduce the flux and current in loop L1-L2 to zero.

It should also be appreciated that the role of WG1 and WG2 could be interchanged by alternating the direction of the windings relative to each other and hence the polarity of the pulses produced by the write gates.

The important feature of the write gates is that they are used to produce feedback current pulses in loop L1 and L2 so as to reduce either a "positive" or a "negative" analog signal in loop L1-L2 to zero to provide the widest dynamic range possible.

In the operation of the circuit of FIG. 3 counter 42 is used to measure the number of pulses needed to reduce the flux induced in L1 and L2 to zero and the polarity of these pulses.

When counter 42 is an up/down counter it will have a count of zero for zero analog input signal. This results from the fact that when the input signal is zero the output at node 38 goes positive and then negative, alternatively whereby a count of zero is established each full cycle. When a series of positive pulses are produced, at node 38, the counter 42 advances by one count, in a positive direction, each cycle of the clock until the flux in L1 and L2 is reduced to zero. In a similar fashion when a series of negative pulses is produced at node 38, the counter 42 advances by one count, in a negative direction, each cycle of the clock, until the flux in L1 and L2 is reduced to zero. The total count is a measure of the amplitude of the input signal.

The circuit of FIG. 3 shows the use of an analog SQUID 24 to couple the flux in inductor L2 to comparator 34. The analog SQUID 24 provides gain. However analog SQUID 24 may be eliminated and inductor L2 may be coupled directly to inductor L5.

Figure 5:
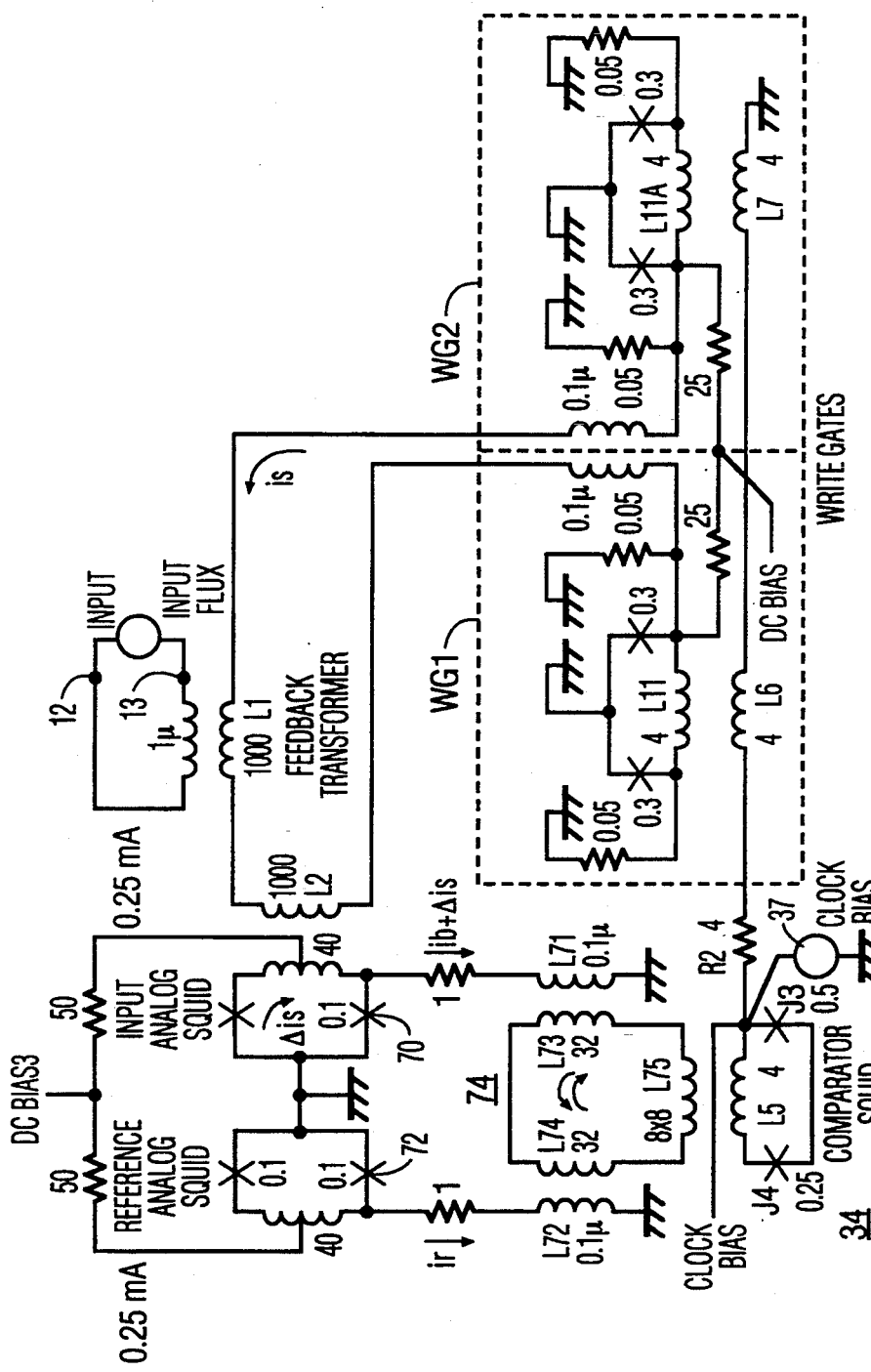
FIG. 5 is a schematic diagram of another circuit embodying the invention.

FIG. 5 illustrates means for eliminating the effect of bias currents introduced in the analog SQUID 24. FIG. 5 includes an input analog SQUID 70 which is biased by DC BIAS 3 to set SQUID 70 at a desired operating level. The output of SQUID 70 is a current which includes a signal component (Ais) and a bias component (iB). To eliminate the effect of the bias component in the signal supplied to the comparator SQUID 34, the circuit of FIG. 5 includes a reference analog SQUID 72. The signal related current from SQUID 70 is coupled via inductors L71 and L73 to inductor summer 74 and the reference current from SQUID 72 is coupled via inductors L72 and L74 to summer 74. The net current (i.e. the signal current, Ais) flows through inductor L75 and is magnetically coupled via L5 to comparator SQUID 34 which functions as described above.

What is claimed is:
1. The combination comprising:
   a first superconducting input loop for conducting an input current;
   a second superconducting loop magnetically coupled to said input loop for carrying a current proportional to said input current;
   a third superconducting comparator loop magnetically coupled to said second loop and including means responsive to the presence of an input current of one polarity for producing fixed amplitude current pulses of a first polarity and responsive to the presence of an input current of opposite polarity to said one polarity for producing fixed amplitude current pulses of a second polarity, opposite said first polarity, said third superconducting comparator loop being magnetically coupled to said second loop for feeding back said current pulses to said second loop, the current pulses fed back to said second loop having a polarity to decrease the amplitude of the current in said second loop.

2. The combination as a claimed in claim 1, wherein said third superconducting comparator loop includes a comparator SQUID to which is applied a source of bipolar clock signals.

3. The combination comprising:
   first, second and third superconducting current carrying loops;
   said first loop including input means for conducting an input current;
   said second loop having:

(a) a first portion magnetically coupled to said first loop for receiving and conducting a current proportional to said input current;

(b) a second portion magnetically coupled to said third loop for transmitting thereto a current proportional to the current in said second loop; and (c) a third portion magnetically coupled to said third loop for receiving feedback current pulses from said third loop having a polarity to reduce the current in said second loop; and said third loop including comparator means magnetically coupled to said second loop and responsive to the current in said second loop for producing current pulses of one polarity when the current in said second loop is of a first polarity and for producing current pulses of a second polarity, opposite said one polarity, when the current in said second loop is of a second polarity opposite said first polarity; and said third loop including inductive means for magnetically feeding back said current pulses to the third portion of said second loop.

4. The combination as claimed in claim 3, wherein said third portion of said second loop includes a superconducting quantum interference device (SQUID) with two Josephson junctions.

5. The combination as claimed in claim 3, wherein said third portion of said second loop includes two superconducting quantum interference devices (SQUIDs), each SQUID having two Josephson junctions.

6. The combination as claimed in claim 3, wherein said first portion of said second loop includes a first inductive means magnetically coupled to said first loop, wherein said second portion of said second loop includes a second inductive means magnetically coupled to said third loop, and wherein said third portion of said second loop includes a third inductive means magnetically coupled to said third loop.

7. The combination as claimed in claim 6, wherein said first, second and third inductive means are connected in series in said second loop.

8. The combination as claimed in claim 7, wherein said third inductive means includes two segments, the first segment for producing current pulses of one polarity into said second loop and the other segment for producing current pulses of opposite polarity, to said one polarity, in said second loop.

9. The combination as claimed in claims 8, wherein each one of said two segments includes a superconducting quantum interference device (SQUID) with two Josephson junctions.

10. The combination as claimed in claim 9, wherein said comparator means includes:

(a) a superconducting quantum interference device (SQUID) with two Josephson junctions;

(b) means magnetically coupling said second loop to said SQUID of said comparator for transferring thereto a current proportional to said input current;

(c) means for supplying bidirectional clock pulses to said SQUID of said comparator; and (d) inductive means coupled to said comparator means for carrying current pulses produced by said comparator and coupling said current pulses to said third portion of said second loop.

11. The combination as claimed in claim 10 further including a countercoupled to said comparator means for counting pulses produced by said comparator.

12. The combination as claimed in claim 10, wherein an analog SQUID is coupled between said second portion of said second loop and said comparator means for magnetically coupling the input current to said comparator means.

* * * * *